United States Patent [19]
Baba

[11] Patent Number: 5,367,268
[45] Date of Patent: Nov. 22, 1994

[54] TRANSMISSION SIGNAL OUTPUT CONTROL CIRCUIT

[75] Inventor: Yoshihiko Baba, Ichikawa, Japan

[73] Assignee: Uniden Corporation, Ichikawa, Japan

[21] Appl. No.: 28,191

[22] Filed: Mar. 9, 1993

[30] Foreign Application Priority Data

Dec. 7, 1992 [JP] Japan .................................. 4-351205

[51] Int. Cl.$^5$ .............................................. A03G 3/20
[52] U.S. Cl. ................................... 330/129; 330/279; 455/126
[58] Field of Search ............... 330/129, 130, 131, 132, 330/80, 85, 279; 455/115, 126

[56] References Cited

U.S. PATENT DOCUMENTS

| | | | |
|---|---|---|---|
| 4,523,155 | 6/1985 | Walczak et al. | 330/279 |
| 5,196,806 | 3/1993 | Ichihara | 455/126 |
| 5,245,297 | 9/1993 | Claydon et al. | 330/129 |

Primary Examiner—James B. Mullins
Assistant Examiner—James Dudek
Attorney, Agent, or Firm—Kanesaka & Takeuchi

[57] ABSTRACT

Disclosed is a transmission signal output control circuit which is formed of an RF amplifier circuit for supplying an amplified RF transmission signal to an antenna circuit; a detector connected to the RF amplifier to detect a transmission signal output level of the RF amplifier; a reference signal generation circuit for generating a reference signal having a selectively changeable signal level; a transmission signal output level control circuit for comparing an output of the detector with the reference signal to thereby supply a control signal to the RF amplifier to thereby control an amplification degree of the RF amplifier to make the RF amplifier produce an RF transmission signal level corresponding to the selected signal level of the reference signal; and a DC bias supply circuit connected to the detector a high-frequency choke coil which has an inductance value selected to cooperate with an intrinsic electrostatic capacitance value of the detector to provide parallel resonance at a frequency of the RF transmission signal.

9 Claims, 4 Drawing Sheets

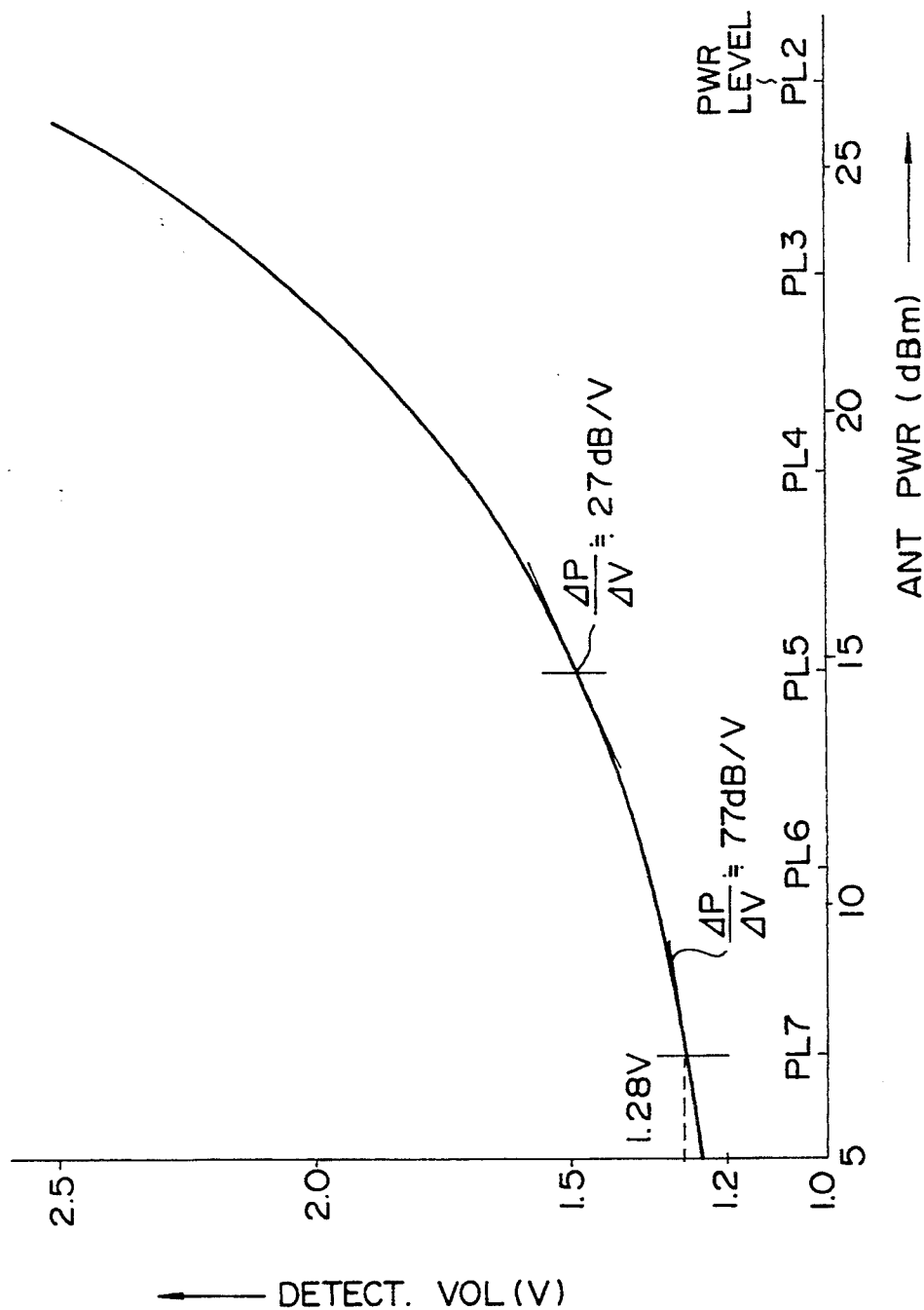

TRANSMISSION SIGNAL OUTPUT CONTROL CIRCUIT

BACKGROUND OF THE INVENTION

1. Field of the Invention

The present invention generally relates to a transmission signal output control circuit in which the transmission signal output level of a radio-frequency (RF) signal is changed over in multi-stages, and particularly relates to an improvement in which the transmission signal output in such a transmission signal output control circuit is made stable.

2. Description of the Prior Art

In a mobile radio communication system represented by a land mobile radiotelephone, a small zone system also called a cellular system has been employed because the transmission signal output can be reduced and the subscriber accommodation capacity can be increased. Reuse of radio wave of one and the same frequency is intentionally performed under system control in such a small zone system, and a transmission signal output control circuit is provided so that the level of the transmission signal output of an RF power amplifier can be selected in a plurality of stages and the frequency of the transmission signal output can be prevented from fluctuating in order to cope with interference between two communication devices in adjacent zones and using the one and same frequency or to cope with deterioration in S/N ratio (as a prior art, for example, reference is made to U.S. Pat. No. 4,523,155).

Such a prior art transmission signal output control circuit will be explained with reference to FIG. 4 in which it is typically illustrated. An RF transmission signal is amplified in an RF amplifier circuit 10 in the final stage and then supplied to an antenna output circuit 11. A detector diode D1 is connected to the output side of the RF amplifier circuit 10 through a resistor $R_1$ and a DC blocking capacitor Ca. That is, the RF transmission signal output after amplified in the RF amplifier circuit 10 is supplied not only to the antenna output circuit 11 but to the detector diode D1 through the resistor $R_1$ and the DC blocking capacitor Ca so that the RF transmission signal output is subjected to detection and half-wave rectification by means of the detector diode $D_1$. The half-wave rectified detection signal is supplied to a transmission signal output level control circuit 14 through a smoothing circuit 12 and a buffer amplifier circuit 13.

The transmission signal output level control circuit 14 compares an output signal of the buffer amplifier circuit 13 with a variable level reference signal supplied from a reference level generation circuit 15, and controls the amplification degree of the RF amplifier circuit 10 so as to make the transmission signal output level of the RF amplifier circuit 10 agree with the selected level of the reference signal. Thus, it is possible that the antenna output circuit 11 is supplied with a RF transmission signal of a desired output level from the RF amplifier circuit 10.

FIG. 5 shows the detection characteristic of the detector diode $D_1$. When a voltage, for example, of 1.28 V is applied as the reference signal to the transmission signal output level control circuit 14, the RF amplifier circuit 10 is controlled so that the detection voltage of the detector diode $D_1$ also has a value of 1.28 V, and as a result the RF transmission signal output from the RF amplifier circuit 10 is set to a power level (PL) 7. Thus, the transmission signal output from the RF amplifier circuit 10 is changed over in a plurality of stages, for example, in six stages from PL2 to PL7 on the basis of the selected reference signal from the reference level generation circuit 15.

Because of scattering of characteristic in each of the parts constituting a transmission signal output control circuit, every individual transmission signal output control circuit has a slight scattering in the detection voltage of the detector diode $D_1$. Correction is therefore made in a manner so that the detection voltage is measured for every output level with respect to each of products in the final inspection process, and the correction value is converted into digital data which is then stored in a memory.

When the correction value is subjected to analog-to-digital conversion, however, a conversion error is inevitably generated because the quantity of information of a digital circuit has a limit. The reason will be described, by way of example, by using the detection characteristic shown in FIG. 5. The ratio $\Delta P/\Delta V$ of a fine change $\Delta P$ of the antenna output power to a fine change $\Delta V$ of the detection voltage is 77 dB/V in the vicinity of the output level of about PL7. This means that the output level changes by 77 dB when the voltage of the reference signal changes by 1 V. Here, if the analog-to-digital conversion error is 20 mV, a deviation of 77 dB/V×20 mV=1.54 dB is generated in the output level.

In order to improve the detection characteristic, on the other hand, the resistance value of the resistor $R_1$ should be reduced to be as small as possible to thereby decrease the quantity of signal attenuation so that the gradient of $\Delta P/\Delta V$ is made sharp to the utmost. In this sense, it is said that it is preferable to select the resistance value of the resistor $R_1$ to be equal to or approximate to zero. If the resistance value is thus selected, however, it means that the detector diode $D_1$ is substantially directly connected to the antenna output circuit 11, and therefore mismatching occurs in the signal transmission circuit to thereby generate a problem of lowering in output, generation of abnormal oscillation, etc. Consequently, the resistance value of the resistor $R_1$ cannot be reduced so extremely.

Further, there is another problem that the detector diode $D_1$ has temperature characteristic. That is, the detection voltage becomes high as the ambient temperature becomes high, while it becomes low as the ambient temperature becomes low. In order to compensate for this tendency, in the prior art circuit of FIG. 4, a diode $D_2$ having quite the same temperature characteristic as that of the detector diode $D_1$ is provided, for the purpose of temperature compensation, in a DC bias circuit 16 of the detector diode $D_1$.

That is, the DC bias circuit 16 is constituted by a series circuit of resistors $R_2$ and $R_3$ for supplying the anode side of the detector diode $D_1$ with a bias voltage (+5 V), and a capacitor $C_1$ and the other ends of which are connected to a connection point between the resistors $R_2$ and $R_3$ and the earth respectively, for the purpose of high-frequency bypassing. Further, the temperature compensating diode $D_2$ is connected with the same polarity as and in parallel to the detector diode $D_1$ so as to cancel the temperature characteristic thereof.

This prior art circuit is, however, not preferable in view of cost because, in addition to the detector diode $D_1$, it is necessary to provide the diode $D_2$ having the same temperature characteristic as that of the diode $D_1$.

Further, in preparation of the diodes, it is necessary to attentively select diodes having quite the same characteristic, so that not a little labor is compelled in such work.

SUMMARY OF THE INVENTION

In view of the foregoing, an object of the present invention is to solve the above problems in the prior art.

According to an aspect of the present invention, the transmission signal output control circuit comprises: an RF amplifier means for amplifying an RF transmission signal and for supplying the amplified transmission signal to an antenna output circuit; a detector means connected to an output side of the RF amplifier means through a first impedance means for detecting a transmission signal output level of the RF amplifier means; a reference signal generation means for generating a reference signal: a transmission signal output level control means for comparing an output signal from the detector means with the reference signal from the reference signal generation means to thereby generate a control signal, and for supplying the control signal to the RF amplifier means to thereby control an amplification degree of the RF amplifier means to make the RF amplifier means produce a transmission signal level corresponding to the level of the reference signal; and a DC bias supply means connected to the detector means through a second impedance means for supplying a DC bias to the detector means, the second impedance means including a high-frequency choking means.

Preferably, the high-frequency choking means is an inductance means having an inductance value selected to cooperate with an intrinsic electrostatic capacitance value of the detector means to provide parallel resonance at a frequency of the RF transmission signal.

If the high-frequency choking means thus cooperates with the capacitance component of the detector means to provide parallel resonance, the impedance at the detector circuit side becomes so large that the loss in the resistor connected between the detector diode and the antenna output circuit decreases to thereby improve the detection characteristic as a result.

Preferably, the reference signal generation means may be a variable level reference signal generation means so that the level of the output reference signal can be changed selectively to thereby select the output transmission signal from the RF amplifier.

BRIEF DESCRIPTION OF THE DRAWINGS

FIG. 5 is a graph for explaining the detection characteristic of the detector diode in the prior art circuit.

DETAILED DESCRIPTION OF THE PREFERRED EMBODIMENT

Figure 1:
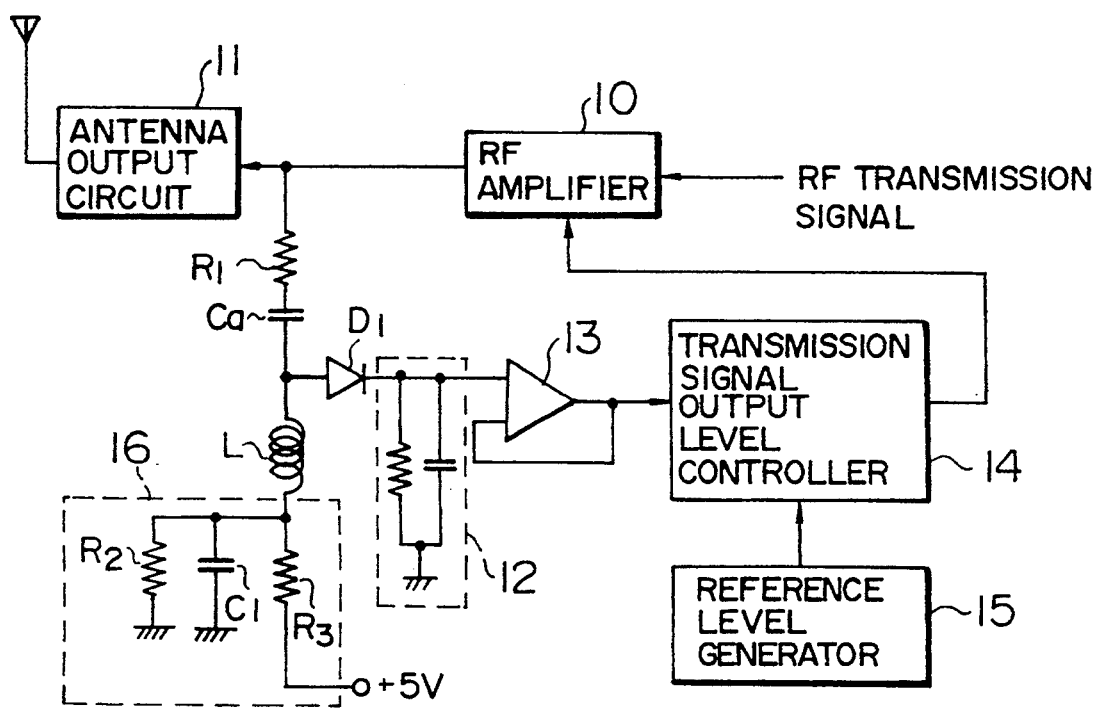
FIG. 1 is a circuit diagram showing an embodiment of the transmission signal output control circuit according to the present invention.
Figure 4:
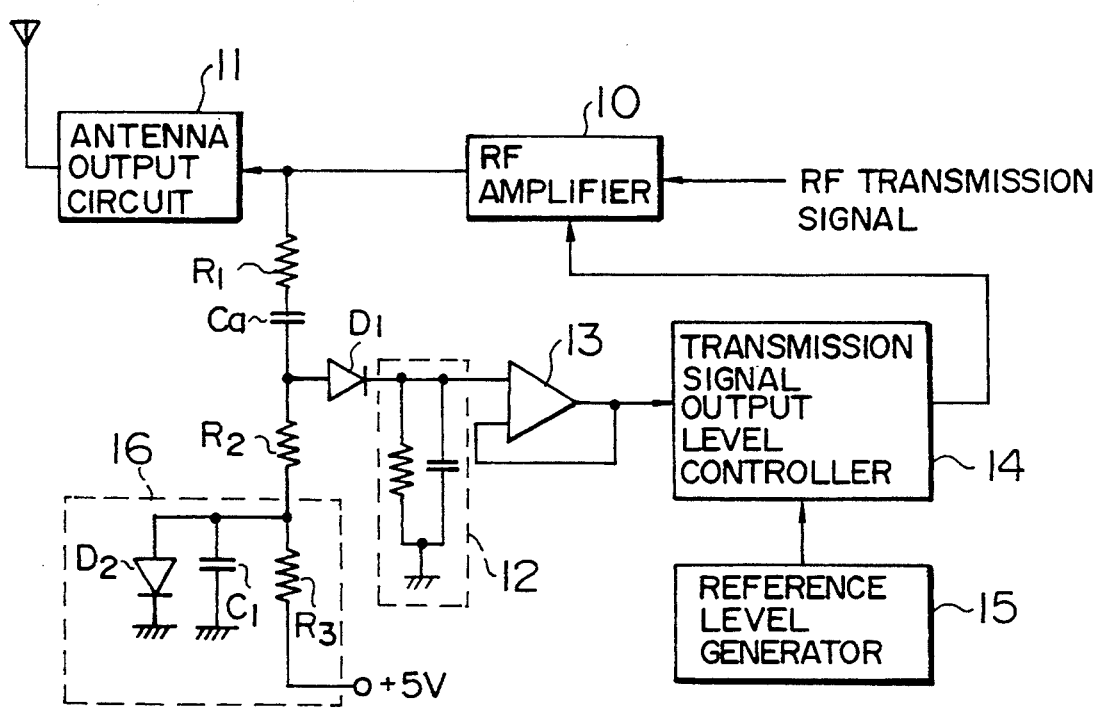
FIG. 4 is a circuit diagram showing a transmission signal output control circuit typically showing a prior art.

Referring to FIG. 1, an embodiment of the transmission signal output control circuit according to the present invention will be described. In FIG. 1, portions which are the same as or equivalent to those in the prior art circuit of FIG. 4 are correspondingly referenced and repetitive explanation is omitted.

As has been described above, in order to improve the detection characteristic of the detector diode $D_1$, it will do to make the ratio $\Delta P/\Delta V$ small to thereby make the gradient of the detection characteristic sharp. To this end, it is necessary to decrease the quantity of attenuation of a signal in the resistor $R_1$ so as to supply the detector diode $D_1$ with a signal as large as possible.

Then, in this embodiment, a high-frequency choke coil L for separating a DC bias circuit 16 of a detector diode $D_1$ from a high frequency circuit including an antenna output circuit 11 is connected to the anode side of the detector diode $D_1$.

Figure 2:
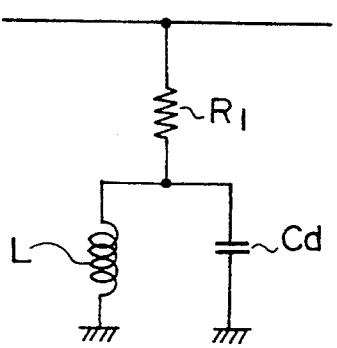
FIG. 2 is an equivalent circuit diagram of the parallel circuit constituted by the RF choke coil and the electrostatic capacitance component of the detector diode used in the embodiment of FIG. 1.

Here, the choke coil L is connected in parallel with the intrinsic electrostatic capacitance component Cd of the detector diode $D_1$ in a high frequency region as shown in an equivalent circuit of FIG. 2. If the inductance value of the choke coil L is suitably selected so that the parallel circuit constituted by the choke coil L and the electrostatic capacitance component Cd provides parallel resonance at a transmission signal frequency, the impedance at the detector circuit side becomes so high that the current flowing through the parallel circuit decreases. Accordingly, the quantity of signal attenuation through a resistor $R_1$ decreases so remarkably that a large signal is applied to the detector diode $D_1$. Further, in this embodiment, the DC bias circuit 16 of the detector diode $D_1$ is constituted by a parallel circuit constituted by resistors $R_2$ and $R_3$ and a capacitor $C_1$.

The impedance Z at the detector circuit side when viewed from the antenna output circuit side was 377-j0 Ω (j represents an imaginary portion) in the case where the inductance of the choke coil L was 10 nH and the transmission frequency was 875 MHz, while the impedance Z at the detector circuit side when viewed from the antenna output circuit was 17.9-j66 Ω in the prior art circuit. Further, the resistance value of the resistor $R_1$ and the characteristic impedance of the antenna output circuit were selected to be 410 Ω and 50 Ω respectively in each of the embodiment and the prior art circuit.

Figure 3:
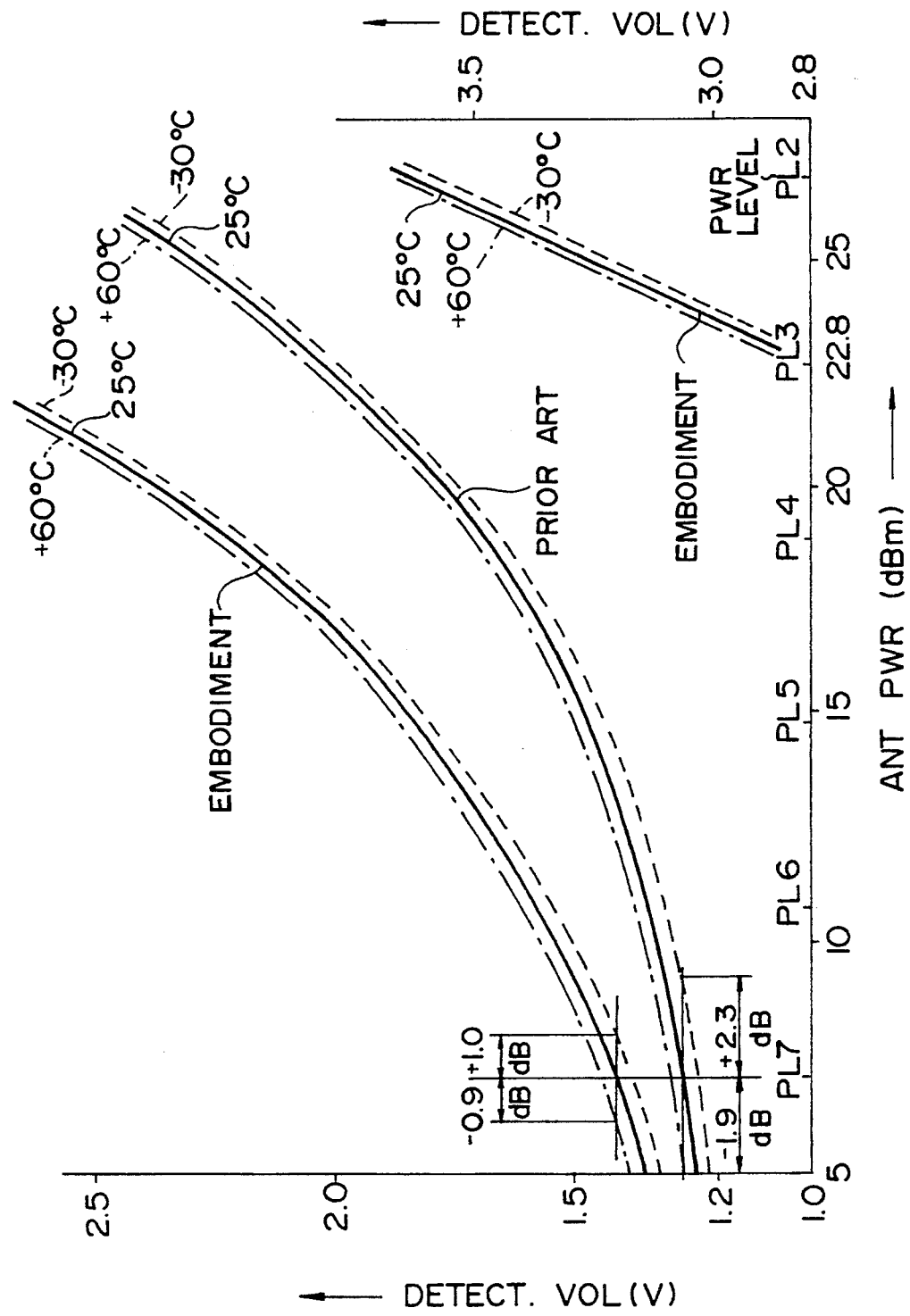
FIG. 3 is a graph for explaining the detection characteristic of the detector diode in the embodiment.

FIG. 3 shows comparison between the detection characteristic improved in this embodiment and the prior art detection characteristic. As seen from the drawing, according to the present invention, the value of $\Delta P/\Delta V$ in the vicinity of PL7 is improved to about the value in the vicinity of PL5 in the prior art circuit, that is, to about 28.0 dB/V. When the analog-to-digital conversion error is 20 mV, therefore, the deviation of the output level at PL7 is 28.0 dB/V×20 mV=0.56 dB, so that an improvement by about 1.0 dB is obtained in comparison with the prior art.

Further, since the detection characteristic is improved as described above, the output-level variation with temperature can be suppressed to a value, for example, within the standard range defined by the FCC (federal communication commission) even without using such a temperature compensating diode as used in the prior art circuit.

In FIG. 3, a solid line, a one-dot chained line above the solid line, and a broken line under the solid line indicate the detection characteristic under the temperate conditions of 25° C., 60° C., and −30° C. respectively. The range of the output-level variation with temperature in the vicinity of PL7 was from +1.0 dB at −30° C. to −0.9 dB at +60° C. according to the present invention, while it was from +2.3 dB at −30° C. to −1.9 dB at +60° C. in the prior art circuit.

Here, Table 1 shows the range of the output level variation with temperature in a range of from +60° C. to −30° C. at each of the output levels (PL2~PL7) in each of the channel numbers of 799 (848.97 MHz), 416 (837.48 MHz), and 991 (824.04 MHz) taking the foregoing analog-to-digital conversion error value (0.56 dB) and the temperature characteristic shown in FIG. 3 into consideration. As seen in Table 1, the maximum width of variation is in a range of from +1.47 dB to −0.94 dB, and this value satisfies the standard "within a range of from +2 dB to −4 dB for each level PL" defined by the FCC.

TABLE 1

| Channel (CH) | PL | +60° C. | −30° C. |
| --- | --- | --- | --- |
| 799 | 2 | −0.18 | 0.18 |
| (848.97 MHz) | 3 | −0.2 | 0.22 |
| | 4 | −0.32 | 0.52 |
| | 5 | −0.37 | 0.52 |
| | 6 | −0.37 | 0.65 |
| | 7 | −0.69 | 0.86 |
| 416 | 2 | −0.15 | 0.2 |
| (837.48 MHz) | 3 | −0.18 | 0.21 |
| | 4 | −0.49 | 0.78 |
| | 5 | −0.58 | 0.8 |
| | 6 | −0.6 | 0.95 |
| | 7 | −0.82 | 1.2 |
| 991 | 2 | −0.16 | 0.21 |
| (824.04 MHz) | 3 | −0.2 | 0.21 |
| | 4 | −0.48 | 0.77 |
| | 5 | −0.56 | 0.87 |
| | 6 | −0.64 | 0.99 |
| | 7 | −0.94 | 1.47 |

Although the choke coil of 10 nH is used in the foregoing embodiment, the inductance value of the choke coil is suitably selected on the basis of the frequency of the RF transmission signal and the relationship with the electrostatic capacitance component of the detector diode $D_1$.

As described above, in the transmission signal output control circuit according to the present invention, a high-frequency choke coil for separation, in the sense of high-frequency, of the DC bias circuit of the detector diode from the high-frequency circuit including the antenna output circuit is provided at the anode side of the detector diode, and the inductance value of the high-frequency choke coil is selected so that the choke coil cooperates with the electrostatic capacitance component of the detector diode so as to provide parallel resonance at the frequency of an RF transmission signal. Thus, the ratio $\Delta P/\Delta V$ representing the detection characteristic of the detector diode is made small so that it is possible to suppress the influence of the analog-to-digital conversion error which is generated when a correction value is obtained. Further, the output-level variation with temperature can be suppressed so that it is not necessary to particularly use any temperature compensating diode.

I claim:

1. A transmission signal output control circuit comprising:
    an antenna output circuit;
    an RF amplifier for amplifying an RF transmission signal, said RF transmission signal amplified by the RF amplifier being supplied to the antenna output circuit;
    a first impedance circuit coupled to an output side of said RF amplifier,
    a detector coupled to the first impedance circuit for detecting a transmission signal output level of said RF amplifier through said first impedance circuit, said detector having electrostatic capacitance inherent therein;
    a reference signal generator for generating a reference signal;
    a transmission signal output level controller coupled to said detector and said reference signal generator for comparing an output signal from said detector with the reference signal from said reference signal generator to generate a control signal, said control signal being supplied to said RF amplifier to control an amplification degree of said RF amplifier to a level corresponding to a level of said reference signal;
    a second impedance circuit coupled to said detector and having an inductance, and
    a DC bias supply coupled to said second impedance circuit for supplying a DC bias to said detector through said second impedance circuit;
    said electrostatic capacitance of said detector and said inductance of said second impedance circuit forming a parallel resonant circuit and being selected such that resonance of the parallel resonant circuit occurs in response to a frequency of said RF transmission signal, and said impedance of the parallel resonant circuit being considerably larger than that of said first impedance circuit with respect to said RF transmission signal.

2. A transmission signal output control circuit according to claim 1, wherein said detector includes a half-wave rectifier constituted by a diode; and a smoothing circuit constituted by a resistor and a capacitor.

3. A transmission signal output control circuit according to claim 1, wherein said first impedance circuit includes a resistance and a DC blocking capacitance.

4. A transmission signal output control circuit according to claim 1, wherein said reference signal generator includes a variable level reference signal generator for generating the reference signal, the level of which is selectively changeable.

5. A transmission signal output control circuit according to claim 2, wherein said reference signal generator includes a variable level reference signal generator for generating the reference signal, the level of which is selectively changeable.

6. A transmission signal output control circuit according to claim 3, wherein said reference signal generator includes a variable level reference signal generator for generating the reference signal, the level of which is selectively changeable.

7. A transmission signal output control circuit according to claim 1, wherein when the resonance of the parallel resonant circuit occurs, impedance at a side of the detector increases to thereby decrease loss at the first impedance circuit between the antenna output circuit and the detector.

8. A transmission signal output control circuit comprising:
    an antenna output circuit;
    an RF amplifier circuit for amplifying an RF transmission signal, said signal amplified by said RF amplifier circuit being supplied to the antenna output circuit;

a series circuit coupled to an output side of said RF amplifier circuit and being formed of a first resistor and a DC blocking capacitor, a detector circuit including a detector diode and being coupled to the output side of said RF amplifier circuit through the series circuit to detect a transmission signal output level of said RF amplifier circuit, said detector diode having an intrinsic electrostatic capacitance;

a reference signal generation circuit for generating a reference signal having a selectively changeable signal level;

a transmission signal output level control circuit coupled to the detector circuit and the reference signal generating circuit, said control circuit comparing an output signal from said detector circuit with the reference signal from said reference signal generation circuit to thereby generate a control signal, said control signal being supplied to said RF amplifier circuit to control an amplification degree of said RF amplifier circuit to a level corresponding to a selected signal level of said reference signal;

a series circuit coupled to said detector circuit and formed of a high frequency choke coil having an inductance, and a DC bias supply circuit coupled to said detector circuit through the series circuit constituted by the high-frequency choke coil;

the electrostatic capacitance of said detector diode and the inductance of said high-frequency choke coil forming a parallel resonant circuit and being selected such that resonance of the parallel resonant circuit occurs in response to a frequency of said RF transmission signal, and the impedance of the parallel resonant circuit being considerably larger than that of said first resistor with respect to said RF transmission signal.

9. A transmission signal output control circuit according to claim 8, wherein when the resonance of the parallel resonant circuit occurs, impedance at a side of the detector circuit increases to thereby decrease loss at the first resistor between the antenna output circuit and the detector diode.

* * * * *